United States Patent
Chou et al.

(10) Patent No.: US 8,302,299 B2
(45) Date of Patent: Nov. 6, 2012

(54) METHOD OF MANUFACTURING A MULTILAYER PRINTED CIRCUIT BOARD WITH A BUILT-IN ELECTRONIC DEVICE

(75) Inventors: Cheng-Hsien Chou, Zhonghe (TW);
Shun-Yueh Hsu, Tucheng (TW);
Kun-Chi Chen, Bangiao (TW);
Hung-Min Chen, Taipei (TW)

(73) Assignee: Unitech Printed Circuit Board Corp., Taipei (TW)

( * ) Notice: Subject to any disclaimer, the term of this patent is extended or adjusted under 35 U.S.C. 154(b) by 33 days.

(21) Appl. No.: 13/013,491

(22) Filed: Jan. 25, 2011

(65) Prior Publication Data
US 2011/0225816 A1    Sep. 22, 2011

(30) Foreign Application Priority Data
Mar. 16, 2010 (TW) .............................. 99107672 A

(51) Int. Cl.
*H01K 3/10* (2006.01)
(52) U.S. Cl. .............. 29/852; 29/830; 29/846; 361/765; 361/766
(58) Field of Classification Search ............. 29/825, 29/830, 840, 846, 852; 361/765, 766
See application file for complete search history.

(56) References Cited

U.S. PATENT DOCUMENTS

| | | | | |
|---|---|---|---|---|
| 5,161,093 A * | 11/1992 | Gorczyca et al. | ............. | 361/795 |
| 6,316,732 B1 * | 11/2001 | Lim | ............. | 174/255 |
| 7,348,662 B2 * | 3/2008 | Miyazaki et al. | ............. | 257/679 |
| 7,957,154 B2 * | 6/2011 | Ito et al. | ............. | 361/765 |
| 8,083,954 B2 * | 12/2011 | Chang et al. | ............. | 216/13 |
| 2006/0203456 A1 * | 9/2006 | Sohn et al. | ............. | 361/748 |
| 2008/0007927 A1 * | 1/2008 | Ito et al. | ............. | 361/764 |

FOREIGN PATENT DOCUMENTS

| | | |
|---|---|---|
| TW | 518616 | 1/2003 |
| TW | I246383 | 12/2005 |

* cited by examiner

*Primary Examiner* — Carl Arbes
(74) *Attorney, Agent, or Firm* — Muncy, Geissler, Olds & Lowe, PLLC

(57) ABSTRACT

A method of manufacturing a multilayer printed circuit board of a built-in electronic device provides a substrate having a copper clad laminate and a first dielectric layer. The first dielectric layer is laminated onto the copper clad laminate and has a cavity for accommodating the electronic device. A second dielectric layer is laminated onto the substrate and electronic device to produce a base circuit board with an embedded electronic device. A build-up circuit layer is formed on the base circuit board. The first and second dielectric layers are made of a plastic material.

15 Claims, 9 Drawing Sheets

METHOD OF MANUFACTURING A MULTILAYER PRINTED CIRCUIT BOARD WITH A BUILT-IN ELECTRONIC DEVICE

BACKGROUND OF THE INVENTION

1. Field of the Invention

The present invention relates to a method of manufacturing a multilayer printed circuit board, and more particularly to a method of manufacturing a multilayer printed circuit board with a built-in electronic device.

2. Description of the Related Art

At present, speed and density are two major requirements of the development of high technologies, and it is a primary objective to satisfy consumer requirements as well as lowering the production cost. Thus, electronic and mobile communication products tend to be developed with a light, thin, short and compact design and come with multi-functions, high reliability and low price. These products are generally developed in generations of every three to five years. To comply with this trend, passive components occupying the largest area in a circuit design of electronic products are integrated.

As to a printed circuit board, the area occupied by the electronic devices has been the greatest limitation for miniaturizing the products. With too many soldering points on the printed circuit board, the reliability will be lowered, and the manufacturing cost will be increased. For a better function, a smaller volume and a lighter weight, related manufacturers and designers try to create more spaces and enhance the functions of modules within the area of the baseboard of the printed circuit board. Obviously, integration and embedment are important factors for the development trend of passive electronic devices.

To overcome the aforementioned issues, R.O.C. Pat. No. 518616 disclosed a method of manufacturing a multilayer printed circuit board with embedded passive components, and this method integrates several film electronic devices into a multilayer printed circuit board, and the key measure of the method is the manufacturing capability of embedding thick and thin film electronic devices into the printed circuit board, such that after the electronic device is integrated into the multilayer printed circuit board while maintaining a good electric precision and minimizing the difference between the original design values, the overall manufacturing process will be more complicated.

The foregoing drawbacks are common, and thus manufacturers try to overcome the drawbacks by the following. R.O.C. Pat. No. I246383 disclosed another method of manufacturing a multilayer printed circuit board of embedded passive components, and this method comprises the steps of: providing a conductive foil having at least one pair of metal bumps, and coupling a passive component to the corresponding metal bump; laminating an organic insulating layer onto a core board; laminating the conductive foil onto the organic insulating layer; and forming a circuit pattern on the conductive foil and coupling with the passive component. However, when the conductive foil coupled with the passive component is laminated onto the organic insulating layer, the passive component has a specific height, and there is a risk of damaging the components or affecting the product reliability, since the organic insulating layer will press the components directly during a thermal pressing process.

SUMMARY OF THE INVENTION

In view of the shortcomings of the prior art, the inventor of the present invention based on years of experience in the related industry to conduct extensive researches and experiments, and finally developed a method of manufacturing a multilayer printed circuit board with a built-in electronic device in accordance with the present invention.

Therefore, it is a primary objective of the invention to overcome the shortcomings of the prior art by providing a method of manufacturing a multilayer printed circuit board with a built-in electronic device, and the method can accommodate more electronic devices in the limited space of a copper clad laminate to achieve the effects of enhancing the function and reducing the volume and weight of the printed circuit board, wherein the built-in electronic device is an active component, a passive component or a light emitting element.

Another objective of the present invention is to increase the pressure resistance by a dielectric layer during a later build-up process of circuits, so as to prevent the embedded electronic devices from being damaged by pressing during the manufacturing process.

To achieve the foregoing objectives, the present invention adopts a method comprising the steps of: providing a substrate, wherein the substrate comprises a copper clad laminate and a first dielectric layer; laminating the first dielectric layer onto the copper clad laminate and pre-forming a cavity at a position capable of accommodating an electronic device precisely; laminating a second dielectric layer on the first dielectric layer and the electronic device to complete a base circuit board with an embedded electronic device, wherein the first and second dielectric layers are made of a plastic material; and building up a circuit on the base circuit board and conducting the electronic device with the build-up circuit.

To achieve the foregoing objectives, the present invention adopts another method comprising the steps of: providing a substrate, wherein the substrate comprises a copper clad laminate and a first dielectric layer; laminating the first dielectric layer onto the copper clad laminate, wherein the copper clad laminate has an electric circuit manufactured thereon by lamination, exposure, development, and etching processes; laminating the first dielectric layer onto the copper clad laminate and pre-forming a cavity at a position capable of accommodating an electronic device precisely; laminating a second dielectric layer on the first dielectric layer and the electronic device to complete a base circuit board with an embedded electronic device, wherein the first and second dielectric layers are made of a plastic material; building up a circuit on the base circuit board and conducting the electronic device with the electric circuit of the copper clad laminate or the build-up circuit.

To achieve the foregoing objectives, the present invention adopts a further method comprising the steps of: providing a substrate, wherein the substrate comprises a copper clad laminate and a first dielectric layer; laminating the first dielectric layer onto the copper clad laminate, wherein the copper clad laminate has an electric circuit manufactured thereon by lamination, exposure, development, and etching processes; installing and conducting an electronic device at a specific position on the electric circuit; laminating the first dielectric layer onto the copper clad laminate, and pre-forming a cavity for accommodating the electronic device; laminating a second dielectric layer on the first dielectric layer and the electronic device to complete a base circuit board with embedded electronic devices, wherein the first and second dielectric layers are made of a plastic material; building up a circuit on the base circuit board; and conducting the electronic device with the electric circuit of the copper clad laminate or the build-up circuit.

To achieve the aforementioned objectives, the present invention adopts another method comprising the steps of: coating a protective plastic layer on the copper clad laminate, and forming a window on the protective plastic layer for accommodating an electronic device.

BRIEF DESCRIPTION OF THE DRAWINGS

To make it easier for our examiner to understand the method of the present invention, preferred embodiments together with related drawings are used for the detailed description of the present invention as follows.

DETAILED DESCRIPTION OF THE PREFERRED EMBODIMENTS

Figure 1A:
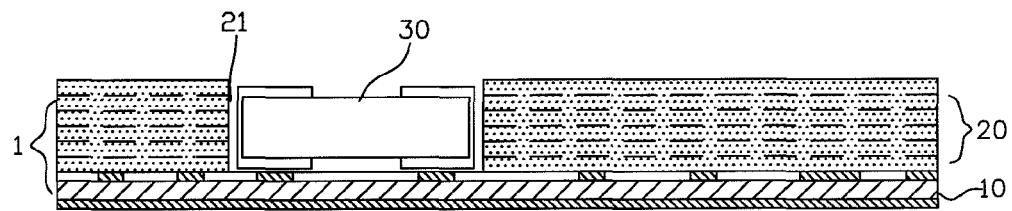
FIGS. 1a~1c show a flow chart of the present invention.
Figure 1B:
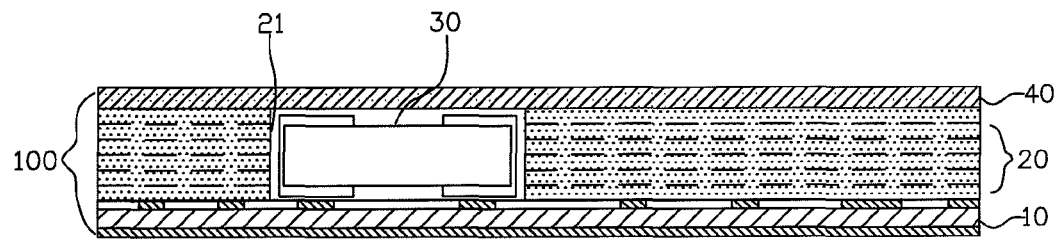
Figure 1C:
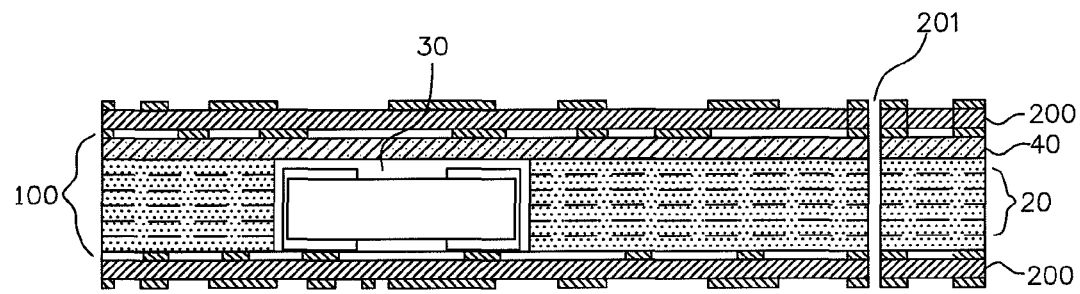

With reference to FIGS. 1a~1c for a method of manufacturing a multilayer printed circuit board of a built-in electronic device in accordance with the present invention, the manufacturing method comprises the steps of:

providing a substrate 1 as shown in FIG. 1a, wherein the substrate 1 includes a copper clad laminate 10 and a first dielectric layer 20;

installing an electronic device 30 on the copper clad laminate 10;

laminating the first dielectric layer 20 onto the copper clad laminate 10, and performing a cavity 21 at a position capable of accommodating the electronic device 30 precisely, wherein the first dielectric layer of this preferred embodiment is a sheet body (and the first dielectric layer can be made of laminating single-layer or multilayer sheets);

laminating a second dielectric layer 40 onto the substrate 1 as shown in FIG. 1b, wherein the second dielectric layer of this preferred embodiment is a sheet body (and the second dielectric layer can be made of laminating single-layer or multilayer sheets), so as to complete a base circuit board 100 with an embedded electronic device;

performing a build-up process for the build-up circuit layer 200 on an external layer (upper/lower layer) of the base circuit board 100 as shown in FIG. 1c, and conducting the electronic device 30 with the base circuit board 100 or the electronic device 30 with the build-up circuit layer 200 to complete a multilayer printed circuit board with an embedded electronic device.

In the method of manufacturing a multilayer printed circuit board with a built-in electronic device, the copper clad laminate 10 is a copper foil layer, or the copper clad laminate 10 is formed by coating polyimide (PI) or prepreg (PP) onto a copper foil layer, or the copper clad laminate 10 is formed by coating a copper foil layer onto a metal board (such as a copper board or an aluminum board).

Wherein, the copper clad laminate 10 includes an electric circuit manufactured onto the copper foil layer by lamination, exposure, development and etching processes.

Wherein, the electronic device 30 can be an active electronic device or a passive electronic device (such as a resistor, a capacitor, an inductor and a chip) or a light emitting element (such as a light emitting diode).

Wherein, the first and second dielectric layers 20, 40 are made of a plastic material, such as a combination of prepregs, a dielectric film and a prepreg, or dielectric films with high resin content, so that the plastic material of the first and second dielectric layers 20, 40 can be filled and stuffed into a gap between the electronic device 30 and the cavity 21 to enhance the fixing strength of the electronic device 30. Meanwhile, the pressure resistance can be increased during the process of building up the build-up circuit layer 200 to prevent the built-in electronic device 30 from being damaged in the manufacturing process.

Figure 2A:
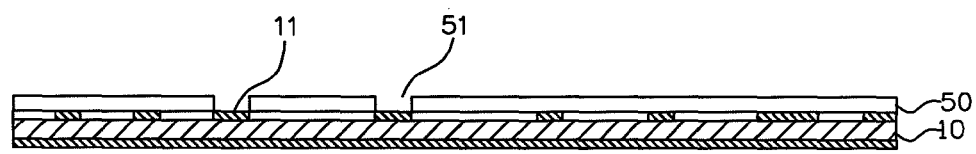
FIGS. 2a~2e show a flow chart of a first preferred embodiment of the present invention.
Figure 2B:
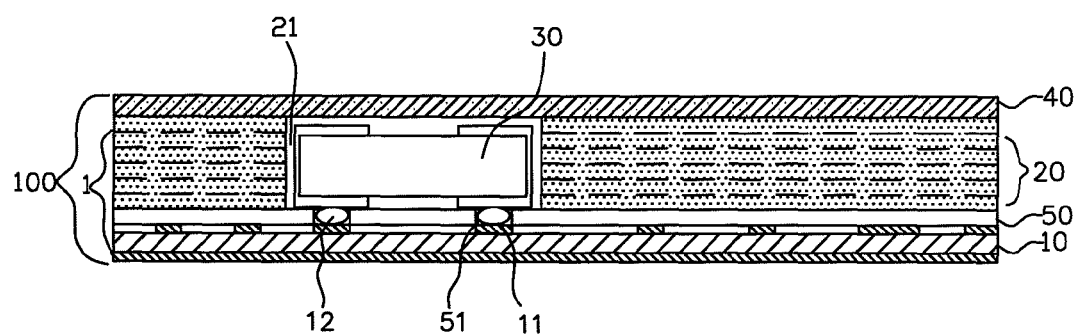
Figure 2C:
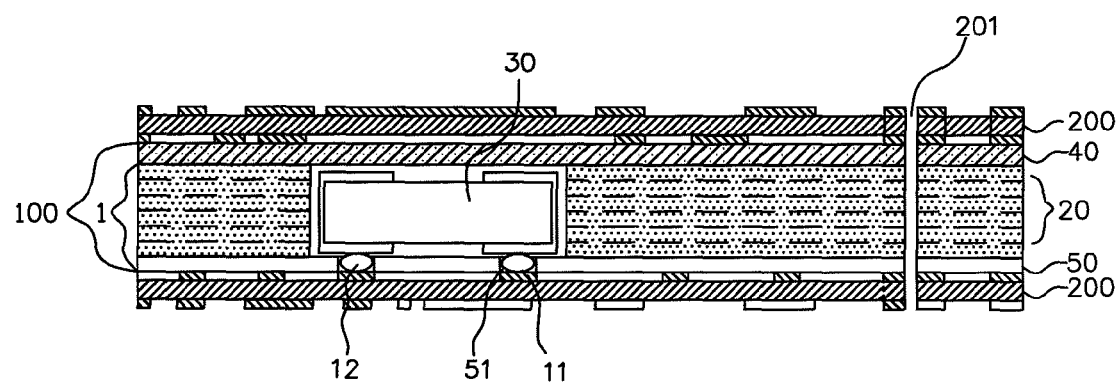
Figure 2D:
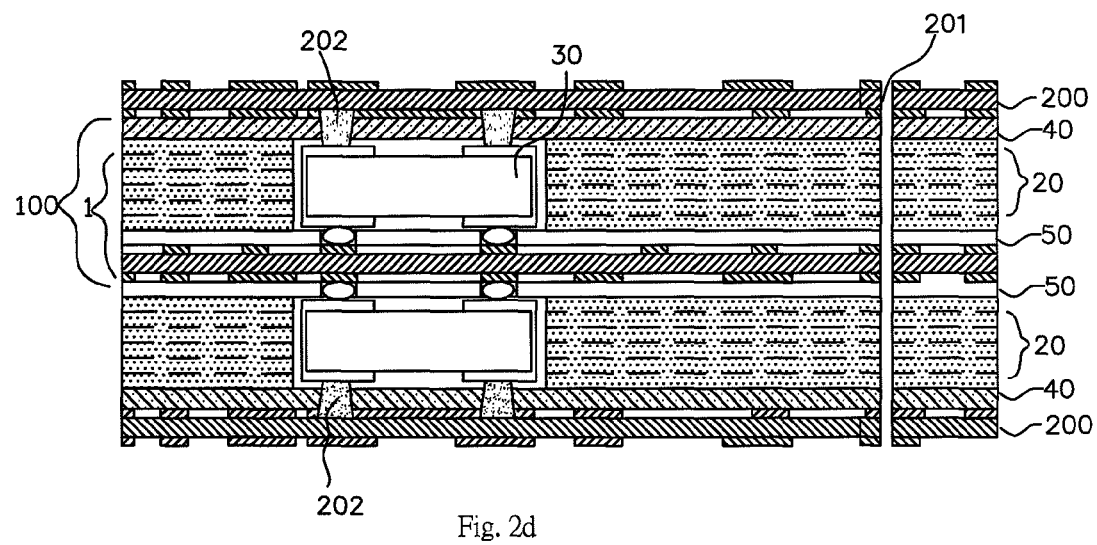

With reference to FIGS. 2a~2d for a flow chart of a method of manufacturing a multilayer printed circuit board with a built-in electronic device in accordance with a first preferred embodiment of the present invention, the manufacturing method comprises the steps of:

providing a substrate 1, wherein the substrate 1 includes a copper clad laminate 10 and a first dielectric layer 20;

forming an electric circuit 11 on the copper clad laminate 10 by lamination, exposure, development and etching processes as shown in FIG. 2a, (wherein the copper clad laminate of this preferred embodiment coats polyimide (PI) or prepeg (PP) onto the copper foil layer;

laminating a protective plastic layer 50 on the copper clad laminate 10 (wherein the protective plastic layer of this preferred embodiment can be a film type or a liquid type resin such as an adhesive glue;

forming at least one window 51 at a specific position by a manufacturing technique such as a laser manufacturing after the protective plastic layer 50 is cured, such that the electric circuit 11 is exposed from the window 51;

installing the electronic device 30 into the cavity 21, and conducting the electronic device 30 (which can be an active or passive electronic device such as a resistor, a capacitor, an inductor and a chip) with the electric circuit 11 as shown in FIG. 2b;

laminating a first dielectric layer 20 onto the protective plastic layer 50, wherein the first dielectric layer 20 has a cavity 21 corresponding to the electronic device 30 and penetrated through the first dielectric layer 20 for sheathing the electronic device 30 to the cavity 21;

laminating a second dielectric layer 40 onto the substrate 1 to produce a base circuit board 100 with an embedded electronic device;

performing a build-up process to the external layer to form a build-up circuit layer 200 after the base circuit board 100 is produced as shown in FIG. 2c;

Wherein, the build-up circuit layer 200 can be laminated onto the second dielectric layer 40 after the electric circuit is formed, so that the through hole 201 can be drilled mechanically and provided for performing a chemical electrodeposit copper of the through hole 201 and electroplating the cavity 21 to produce a multilayer printed circuit board with an embedded electronic device;

Alternatively, the build-up circuit layer 200 can be a copper foil layer as shown in FIG. 2d and the second dielectric layer 40 at the top of the electronic device 30 can be removed by laser to form a micro via 202 and a chemical electrodeposit copper and an electroplating process are performed in the micro via 202 to conduct the electronic device 30 with the build-up circuit layer 200 (and the base circuit board 100 in this preferred embodiment is symmetrically installed), such that a through hole 201 can be drilled mechanically to perform the chemical electrodeposit copper and electroplating process of the through hole 201 to electrically conduct the basic circuit board 100 and the built-up circuit layer 200 and to produce another type of multilayer printed circuit board with an embedded electronic device.

In the foregoing preferred embodiment, a conditioning process takes place to increase the adhesive force before the protective plastic layer 50 is coated onto a surface of the copper clad laminate 10.

Wherein, a conductive paste 12 is coated at the conducting position on the electric circuit 11 with the electronic device 30 before the electronic device 30 is installed to the window 51, such that good binding force and conductivity between the electronic device 30 and the electric circuit 11 can be achieved.

Wherein, the first and second dielectric layers 20, 40 can be formed by laminating a single layer or a plurality of layers.

Wherein, the first and second dielectric layers 20, 40 with a plastic property are made of a combination of prepregs, a dielectric film and a prepreg, and dielectric films with high resin content, so that the first and second dielectric layers 20, 40 with a plastic property can be filled and stuffed into a gap between the electronic devices 30 to increase the fixing strength of the electronic device 30. Similarly, the pressure resistance can be increased to prevent the embedded electronic device 30 from being damaged by the thermal pressing during the manufacturing process when the build-up circuit layer 200 is added to the second dielectric layer 40.

Figure 2E:
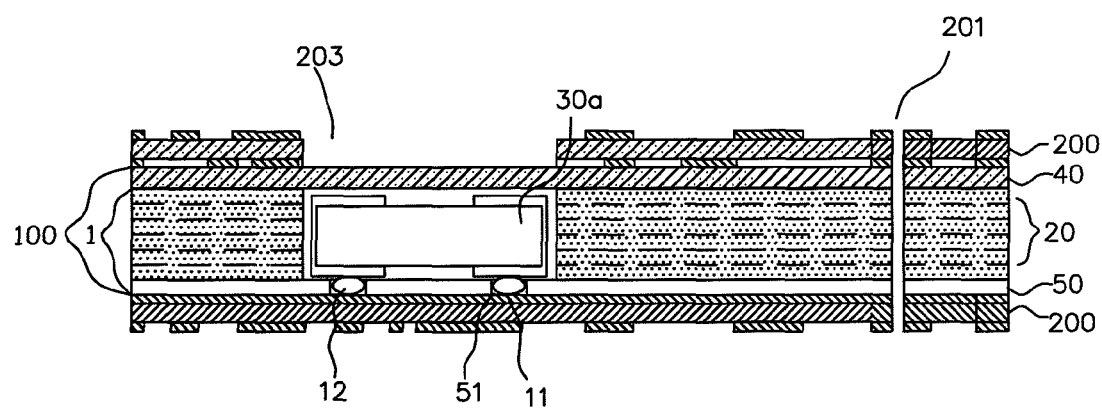

Wherein, the electronic device can be a light emitting element 30a (or a light emitting diode) as shown in FIG. 2e, but the manufacturing methods for the active and passive components are different. When the build-up circuit layer 200 is added to the second dielectric layer 40, the build-up circuit layer 200 comes with an opening 203 formed at a position opposite to the light emitting element 30a for exposing the light emitting element 30a without being covered.

Wherein, the second dielectric layer 40 is attached onto the light emitting element 30a to prevent the first dielectric layer 20 from being overflowed when the build-up circuit layer 200 is added and laminated.

Wherein, the light emitting element 30a and the electric circuit 11 are adhered by a conductive paste 12 (or fixed by a solder) to define an electric conduction.

Figure 3A:
FIGS. 3a~3f show a flow chart of a second preferred embodiment of the present invention.
Figure 3B:
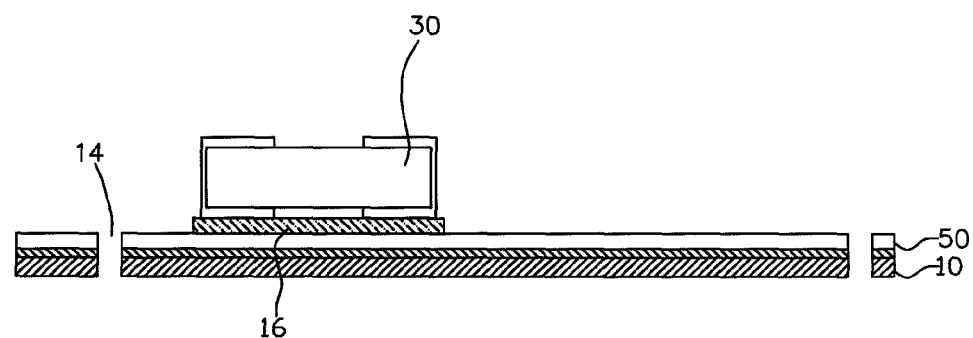
Figure 3C:
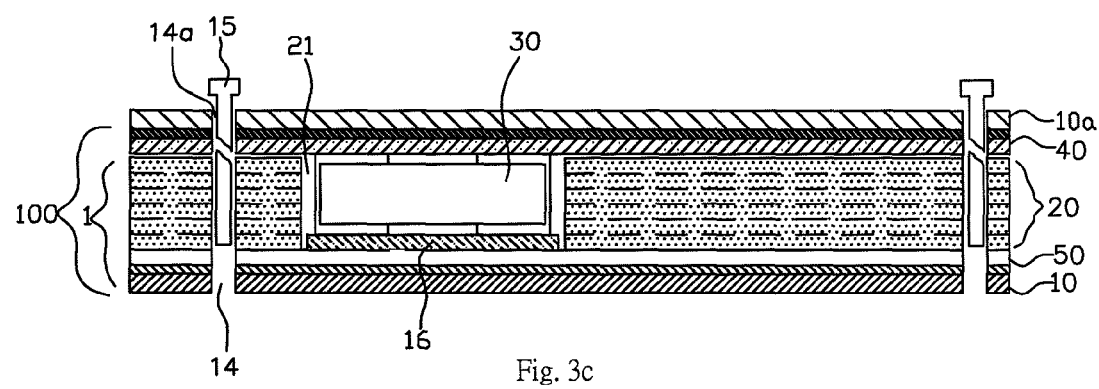
Figure 3D:
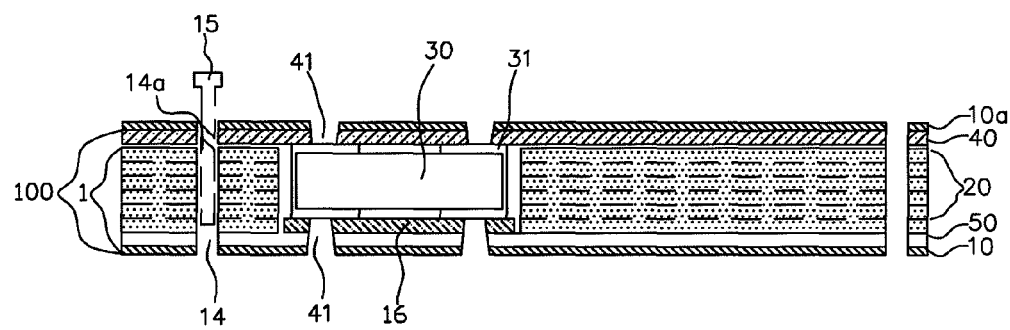
Figure 3E:
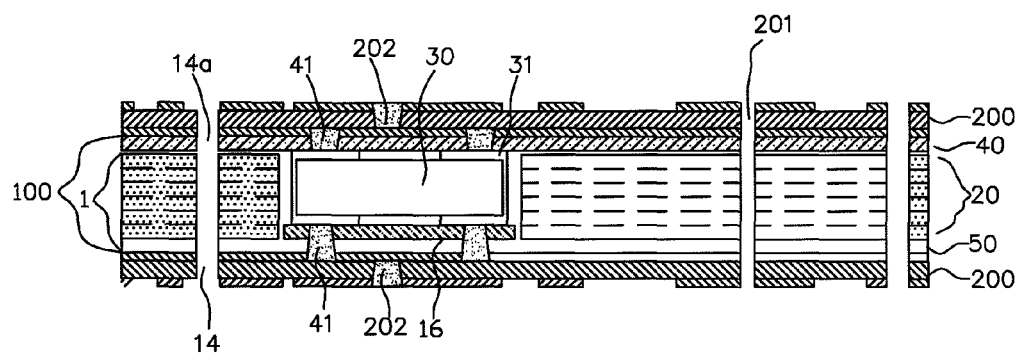

With reference to FIGS. 3a~3f for a flow chart of a method of manufacturing a multilayer printed circuit board with a built-in electronic device in accordance with a second preferred embodiment of the present invention, the manufacturing method comprises the steps of:

providing a substrate 1, wherein the substrate 1 includes a copper clad laminate 10 and a first dielectric layer 20;

forming an a copper foil layer onto a metal board (such as a copper board or an aluminum board metal board) of the copper clad laminate 10 as shown in FIG. 3a, (wherein the copper clad laminate of this preferred embodiment coats polyimide (PI) or prepeg (PP) onto the copper foil layer);

coating a protective plastic layer 50 (which is made of a film type or a liquid type resin such as an adhesive glue this preferred embodiment) onto the copper clad laminate 10;

coating an adhesive agent 16 (which is a red glue in this preferred embodiment) at a specific position on the protective plastic layer 50 as shown in FIG. 3b, wherein the electronic device 30 can be an active electronic device or a passive electronic device (such as a resistor, a capacitor, an inductor and a chip) or a light emitting element (such as a light emitting diode) installed on the adhesive agent 16, such that the adhesive agent 16 can be used for fixing the electronic device 30 onto the protective plastic layer 50 of the copper clad laminate 10 securely;

laminating a first dielectric layer 20 onto the protective plastic layer 50, and forming a cavity 21 penetrated through the first dielectric layer 20 and corresponding to the electronic device 30 and provided for sheathing on the electronic device 30, wherein the first dielectric layer 20 can be formed by laminating a single or a plurality of layers as shown in FIG. 3c;

laminating a second dielectric layer 40 onto the substrate 1 to produce a base circuit board 100 with an embedded electronic device;

laminating a second copper clad laminate 10a onto the second dielectric layer 40, wherein the second copper clad laminate has the same structure as the first copper clad laminate in this preferred embodiment), and the second copper clad laminate has a side of the copper foil layer aligned with and attached onto the second dielectric layer);

performing a lamination process to the base circuit board 100 and the second copper clad laminate 10a;

removing the portion of metal boards of the base circuit board 100 and the second copper clad laminate 10a after the lamination process takes place as shown in FIG. 3d;

using a manufacturing technique (such as a laser manufacturing) to form micro vias 41 on the second dielectric layer 40 and the protective plastic layer 50 and at positions opposite to the electronic device 30 for exposing an electrode terminal 31 of the electronic device 30;

performing a chemical electrodeposit copper and an electroplating process to the micro vias 41 of the copper foil layers of the copper clad laminate 10 and the second copper clad laminate 10a, to manufacture the electric circuit and define an electric conduction of the electronic device 30 with the electric circuits of the first copper clad laminate 10 and the second copper clad laminate 10a; and laminating a build-up circuit layer 200 onto the base circuit board 100, forming a blind hole 202 on the build-up circuit layer 200, and performing a chemical electrodeposit copper and an electroplating process as shown in FIG. 3e, such that the first copper clad laminate 10 and the second copper clad laminate 10a and an electric circuit of the build-up circuit layer 200 are conducted, and then a through hole 201 is drilled mechanically, and a chemical electrodeposit copper and an electroplating of the through hole 201 are performed to electrically conduct the basic circuit board 100 and the build-up circuit layer 200 and to produce a multilayer printed circuit board with an embedded electronic device, In the foregoing preferred embodiment, a conditioning process takes place to increase the adhesive force of the surfaces before the first copper clad laminate 10 and the second copper clad laminate 10a are coated with the protective plastic layer 50.

Wherein, after the protective plastic layer 50 is cured, a fixing hole 14 is formed and penetrated through the protective plastic layer 50, and the second copper clad laminate 10a includes a fixing hole 14a formed at a position opposite to the fixing hole 14 of the copper clad laminate 10, and the fixing holes 14, 14a are passed and fixed by a fixing element 15 (which is a rivet in this preferred embodiment), and the fixing element 15 can be removed together while the metal boards of the first copper clad laminate 10 and the second copper clad laminate 10a are removed.

Wherein, the first and second dielectric layers 20, 40 are made of a plastic material, such as a combination of prepregs, a dielectric film and a prepreg, or dielectric films with high resin content, so that the plastic material of the first and second dielectric layers 20, 40 can be filled and stuffed into a gap between the electronic device 30 to enhance the fixing strength of the electronic device 30. Meanwhile, the pressure resistance can be increased during the process of building up the build-up circuit layer 200 to prevent the built-in electronic device 30 from being damaged in the manufacturing process.

Figure 3F:
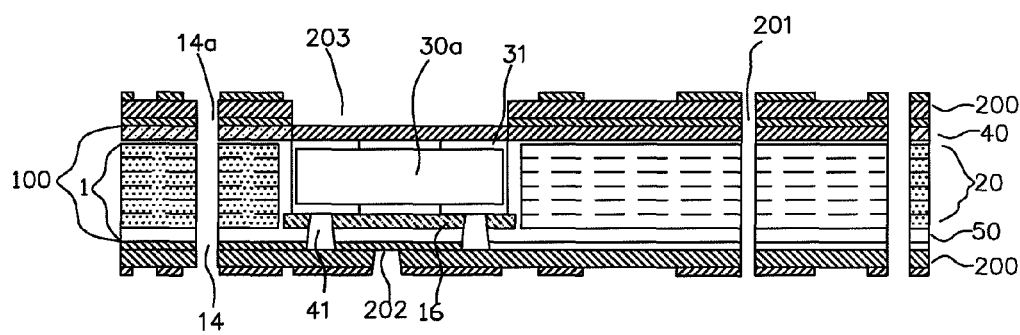

Wherein, the electronic device can be a light emitting element 30*a* (or a light emitting diode) as shown in FIG. 3*f*, but the manufacturing methods for the active and passive components are different. When the build-up circuit layer 200 is added to the second dielectric layer 40, the build-up circuit layer 200 comes with an opening 203 formed at a position opposite to the light emitting element 30*a* for exposing the light emitting element 30*a* without being covered.

Figure 4A:
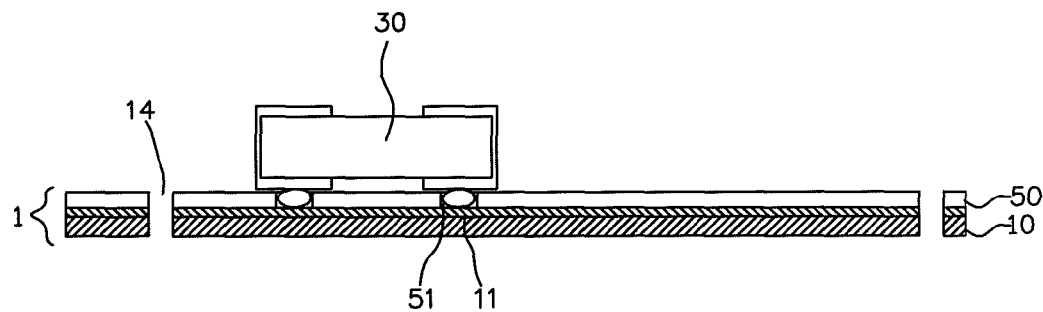
FIGS. 4a~4c show another flow chart of a second preferred embodiment of the present invention.
Figure 4B:
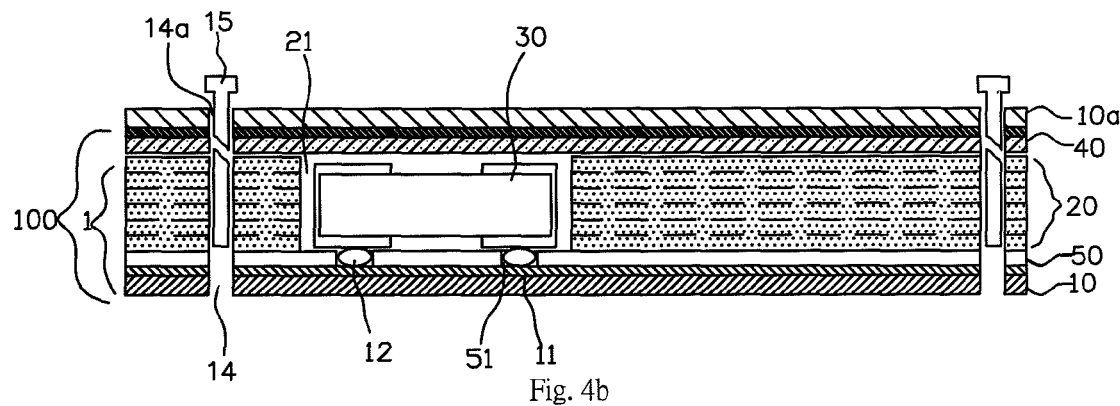
Figure 4C:
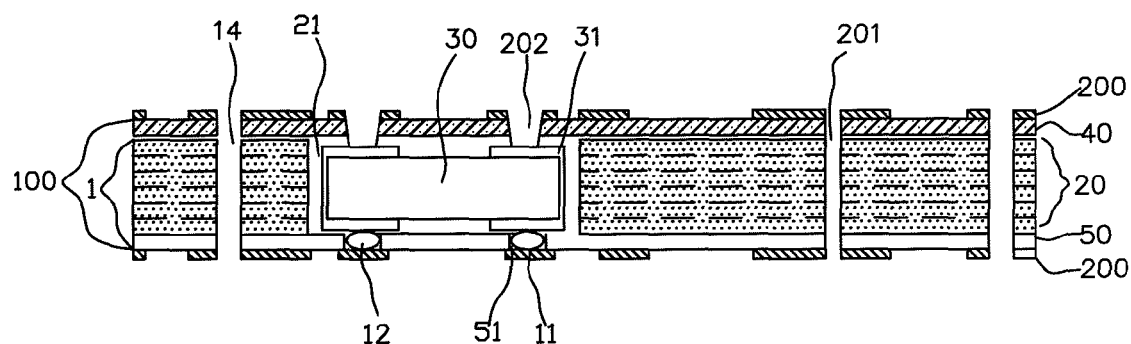

With reference to FIGS. 4*a*~4*c* for a second flow chart of a method of manufacturing a multilayer printed circuit board with a built-in electronic device in accordance with a second preferred embodiment of the present invention, the major difference resides on that a substrate 1 having a copper clad laminate 10 and a first dielectric layer 20 is provided.

In FIG. 4*a*, the copper clad laminate 10 has a copper foil layer attached onto a metal board (such as a copper board or an aluminum board).

A protective plastic layer 50 is laminated on the copper clad laminate 10 (wherein the protective plastic layer of this preferred embodiment can be a film type or a liquid type resin such as an adhesive glue).

At least one window 51 is formed at a specific position by a manufacturing technique such as a laser manufacturing after the protective plastic layer 50 is cured, such that the electric circuit 11 is exposed from the window 51.

A protective plastic layer 50 is coated onto the copper clad laminate 10, and after the protective plastic layer 50 is cured, at least one window 51 is formed at a specific position by a manufacturing technique (such as a laser manufacturing process) for exposing a specific position of the electric circuit 11, and then a metal terminal of the electronic device 30 is installed into the window 51 to conduct the electronic device 30 with the electric circuit 11.

In FIG. 4*b*, a first dielectric layer 20 is laminated onto the protective plastic layer 50, and the first dielectric layer 20 has a cavity 21 penetrated through the first dielectric layer 20 and corresponding to the electronic device 30, such that the cavity 21 can be sheathed on the electronic device 30. A second dielectric layer 40 is laminated onto the substrate 1 to produce a base circuit board 100 with an embedded electronic device.

A second copper clad laminate 10*a* (which has the same structure of the first copper clad laminate in this preferred embodiment, and the second copper clad laminate has a side of the copper foil layer facing and being attached onto the second dielectric layer) onto the second dielectric layer 40.

The base circuit board 100 and the second copper clad laminate 10*a* are laminated.

In FIG. 4*c*, the metal boards of the base circuit board 100 and second copper clad laminate 10*a* are removed, after the lamination process takes place.

A build-up circuit layer 200 is added to copper foil layers of the first copper clad laminate 10 and the second copper clad laminate 10*a*, and a micro via 202 is formed separately on the second copper clad laminate 10*a* and the build-up circuit layer 200, and a chemical electrodeposit copper and an electroplating process are performed, such that the electric circuits of the second copper clad laminate 10*a* and the build-up circuit layer 200 are conducted.

A through hole 201 is drilled mechanically, and a chemical electrodeposit copper and an electroplating of the through hole 201 are performed to electrically conduct the basic circuit board 100 and the built-up circuit layer 200 and to produce a multilayer printed circuit board with an embedded electronic device.

Wherein, the second dielectric layer 40 is attached onto the light emitting element 30*a* for preventing the overflow of the first dielectric layer 20 when the build-up circuit layer 200 is added.

Wherein, the electronic device 30 and the electric circuit 11 are adhered by a conductive paste 12 (or fixed by a solder) to define an electric conduction.

Figure 5A:
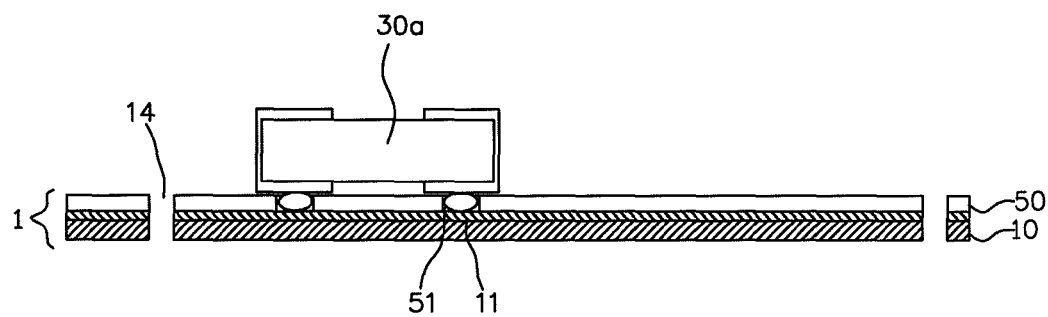
FIGS. 5a~5c show a further flow chart of a second preferred embodiment of the present invention.
Figure 5B:
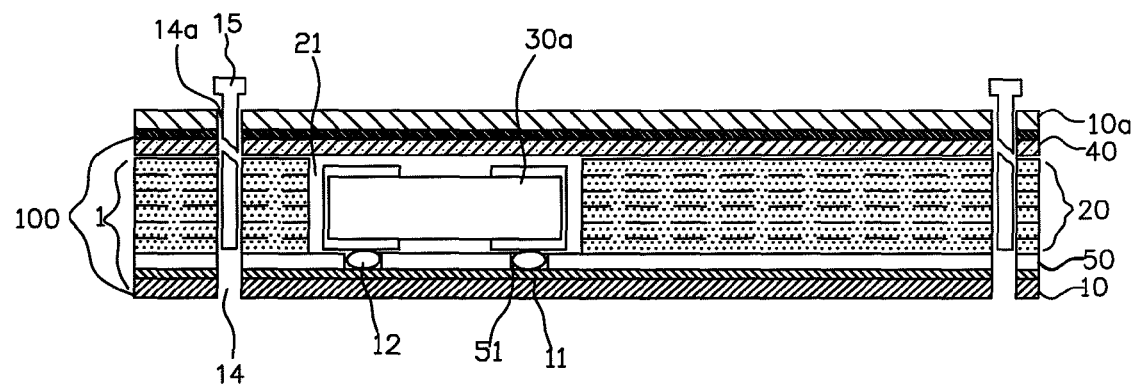
Figure 5C:
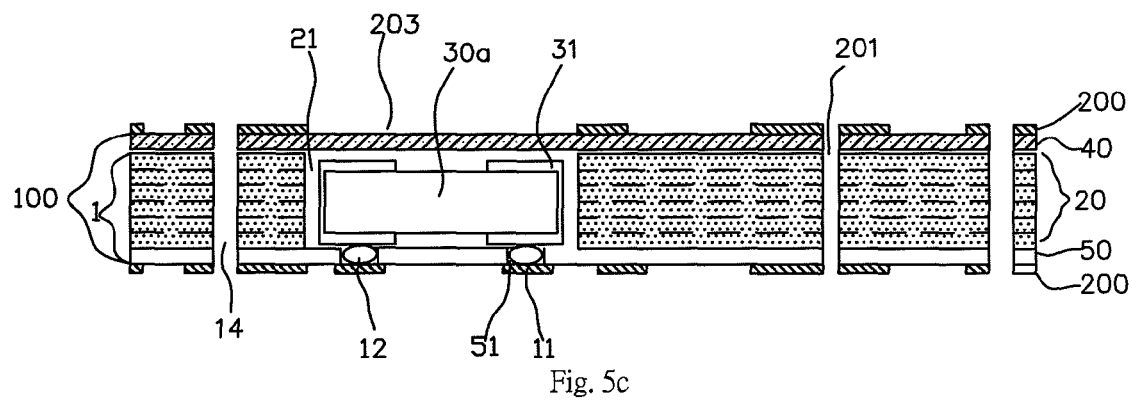

With reference to FIGS. 5*a*~5*c* for a chart of a method of manufacturing a multilayer printed circuit board with a built-in electronic device in accordance with a third preferred embodiment of the present invention, the major difference resides on that a substrate 1 having a copper clad laminate 10 and a first dielectric layer 20 is provided.

In FIG. 5*a*, the copper clad laminate 10 has a copper foil layer attached onto a metal board (which is a copper board or an aluminum board).

A protective plastic layer 50 is laminated on the copper clad laminate 10 (wherein the protective plastic layer of this preferred embodiment can be a film type or a liquid type resin such as an adhesive glue).

At least one window 51 is formed at a specific position by a manufacturing technique such as a laser manufacturing after the protective plastic layer 50 is cured, such that the electric circuit 11 is exposed from the window 51.

A protective plastic layer 50 is coated onto the copper clad laminate 10, and after the protective plastic layer 50 is cured, at least one window 51 is formed at a specific position by a manufacturing technique (such as a laser manufacturing process) for exposing a specific position of the electric circuit 11, and then a metal terminal of the electronic device 30 is installed into the window 51 to conduct the electronic device 30 with the electric circuit 11.

In FIG. 5*b*, a first dielectric layer 20 is laminated onto the protective plastic layer 50, and the first dielectric layer 20 has a cavity 21 penetrated through the first dielectric layer 20 and corresponding to the light emitting element 30*a*, such that the cavity 21 can be sheathed on the light emitting element 30*a*. A second dielectric layer 40 is laminated onto the substrate 1 to produce a base circuit board 100 with an embedded electronic device.

A second copper clad laminate 10*a* (which has the same structure of the first copper clad laminate in this preferred embodiment, and the second copper clad laminate has a side of the copper foil layer facing and being attached onto the second dielectric layer) onto the second dielectric layer 40.

The base circuit board 100 and the second copper clad laminate 10*a* are laminated.

In FIG. 5, after the lamination process takes place, the metal boards of the base circuit board 100 and the second copper clad laminate 10*a* are removed. A build-up circuit layer 200 is added to copper foil layers of the first copper clad laminate 10 and the second copper clad laminate 10*a*, and a through hole 201 is formed, and a chemical electrodeposit copper and an electroplating process are performed to produce a multilayer printed circuit board with an embedded light emitting element.

Similarly, when the build-up circuit layer 200 is formed on the second dielectric layer 40, the build-up circuit layer 200 comes with an opening 203 formed at a position opposite to the light emitting element 30*a* for exposing the light emitting element 30*a* without being covered.

Wherein, the second dielectric layer 40 is attached onto the light emitting element 30*a* for preventing the overflow of the first dielectric layer 20 when the build-up circuit layer 200 is added.

Wherein, the light emitting element 30a and the electric circuit 11 are adhered by a conductive paste 12 (or fixed by a solder) to define an electric conduction.

Figure 6A:
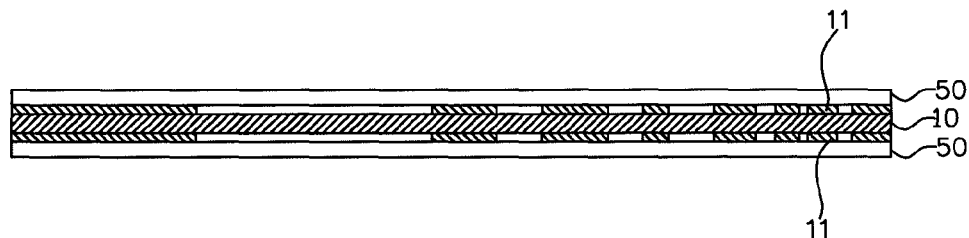
FIGS. 6a~6d show a flow chart of a third preferred embodiment of the present invention.
Figure 6B:
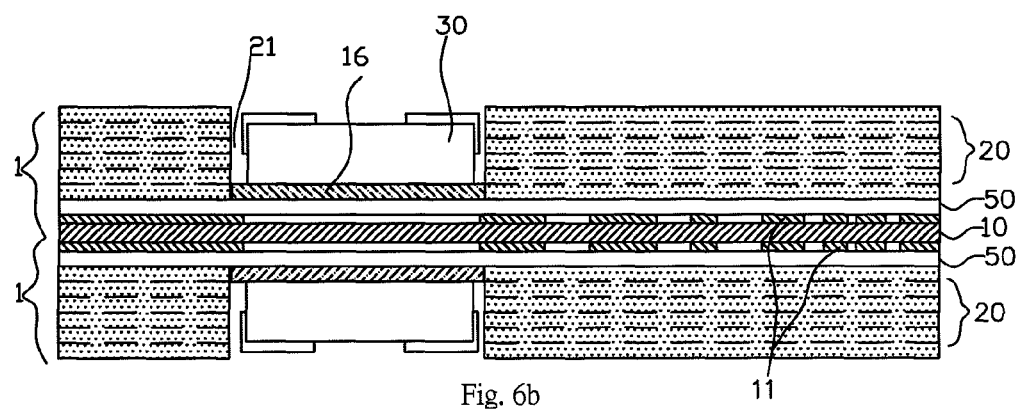
Figure 6C:
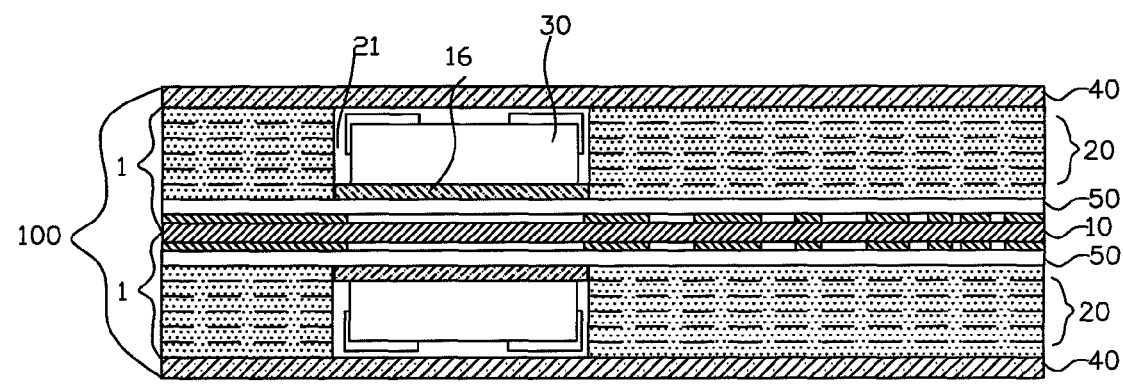
Figure 6D:
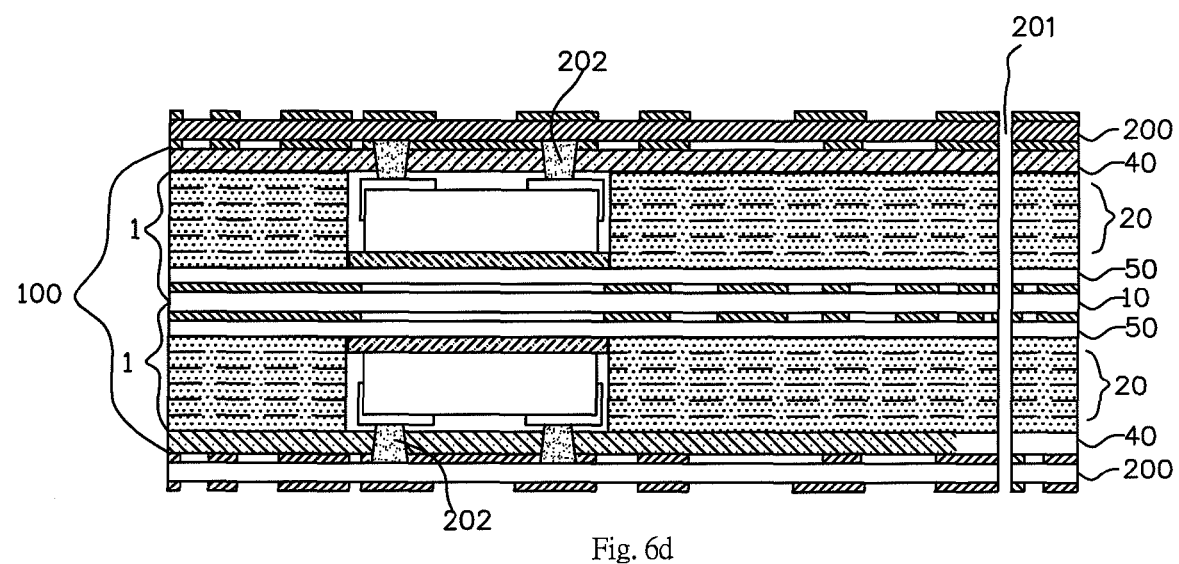

With reference to FIGS. 6a~6d for a flow chart of a method of manufacturing a multilayer printed circuit board with a built-in electronic device in accordance with a third preferred embodiment of the present invention, the manufacturing method comprises the steps of:

providing a substrate 1, wherein the substrate 1 includes a copper clad laminate 10 and a first dielectric layer 20;

forming an electric circuit 11 on the copper clad laminate 10 by lamination, exposure, development and etching processes as shown in FIG. 6a, (wherein the copper clad laminate of this preferred embodiment coats polyimide (PI) or prepeg (PP) onto the copper foil layer;

coating a protective plastic layer 50 onto the copper clad laminate 10 (wherein the protective plastic layer of this preferred embodiment can be made of a film type or a liquid type resin such as an adhesive glue), and coating an adhesive agent 16 (which is a red glue in this preferred embodiment) at a specific position after the protective plastic layer 50 is cured, wherein the electronic device 30 can be an active electronic device or a passive electronic device (such as a resistor, a capacitor, an inductor and a chip) or a light emitting element (such as a light emitting diode) installed on the adhesive agent 16, such that the adhesive agent 16 can be used for fixing the electronic device 30 onto the protective plastic layer 50 of the copper clad laminate 10 securely;

laminating a first dielectric layer 20 on the protective plastic layer 50, and forming a cavity 21 penetrated through the first dielectric layer 20 and corresponding to the electronic device 30, such that the cavity 21 can be sheathed on the electronic device 30 as shown in FIG. 6b, wherein the first dielectric layer 20 can be formed by laminating a plurality of layers;

laminating a second dielectric layer 40 on the substrate 1 to produce a base circuit board 100 with an embedded electronic device as shown in FIG. 6c, wherein the second dielectric layer 40 can be made of laminating a plurality of layers;

laminating a build-up circuit layer 200 (which is a copper foil layer in this preferred embodiment) onto the second dielectric layer 40 after the base circuit board 100 is produced, and then using laser to remove the second dielectric layer 40 at the top of the electronic device 30 to form a micro via 202 and performing a chemical electrodeposit copper and an electroplating process to the micro via 202 to conduct the electronic device 30 with the build-up circuit layer 200 as shown in FIG. 6d; and drilling a through hole 201 mechanically, and performing the chemical electrodeposit copper and electroplating process of the through hole 201 to electrically conduct the basic circuit board 100 and the built-up circuit layer 200 and to produce a multilayer printed circuit board with an embedded electronic device;

In the foregoing preferred embodiment, a conditioning process takes place to increase the adhesive force before the protective plastic layer 50 is coated onto a surface of the copper clad laminate 10.

Wherein, the first and second dielectric layers 20, 40 are made of a plastic material, such as a combination of prepregs, a dielectric film and a prepreg, or dielectric films with high resin content, so that the plastic material of the first and second dielectric layers 20, 40 can be filled and stuffed into a gap between the electronic device 30 and the cavity 21 to enhance the fixing strength of the electronic device 30. Meanwhile, the pressure resistance can be increased during the process of building up the build-up circuit layer onto the second dielectric layer 40 to prevent the built-in electronic device 30 from being damaged in the manufacturing process.

Obviously, the present invention can improve over the prior art and comply with the patent application requirements, and thus the invention is duly filed for patent application. While the invention has been described by device of specific embodiments, numerous modifications and variations could be made thereto by those generally skilled in the art without departing from the scope and spirit of the invention set forth in the claims.

What is claimed is:

1. A method of manufacturing a multilayer printed circuit board of a built-in electronic device, comprising the steps of;
providing a substrate, and the substrate including a copper clad laminate with a metal board and a copper foil layer coated onto the metal board;
laminating a first dielectric layer with a plastic property onto the copper clad laminate, and the first dielectric layer formed by laminating a plurality of layers, and having a cavity penetrated through the first dielectric layer;
installing the electronic device into the cavity and laminating a second dielectric layer with a plastic property onto the substrate and the electronic device to produce a base circuit board; and
forming an electric circuit on the base circuit board;
wherein the second dielectric layer sequentially comprises a second copper clad laminate laminated thereon and having a metal board and a copper foil layer, and the copper foil layer is coated on the metal board, and after the copper clad laminate and the second copper clad laminate are attached closely by a lamination process, the metal boards are removed.

2. The method of manufacturing a multilayer printed circuit board of a built-in electronic device according to in claim 1, wherein after the metal boards are removed, an electric circuit layer is formed on the copper foil layer.

3. The method of manufacturing a multilayer printed circuit board of a built-in electronic device according to in claim 1, wherein before the copper clad laminate and the second copper clad laminate are attached closely, a fixing hole is formed and penetrated separately through corresponding positions of the first copper clad laminate and the second copper clad laminate, and a fixing element is passed through the fixing holes for fixing the first and second copper clad laminates.

4. The method of manufacturing a multilayer printed circuit board of a built-in electronic device according to in claim 1, wherein the copper clad laminate is coated with a protective plastic layer.

5. The method of manufacturing a multilayer printed circuit board of a built-in electronic device according to in claim 4, wherein the protective plastic layer is made of film type or liquid type resin.

6. The method of manufacturing a multilayer printed circuit board of a built-in electronic device according to in claim 5, wherein the protective plastic layer is coated with an adhesive agent at a contact position with the electronic device to fix the electronic device onto the protective plastic layer securely.

7. The method of manufacturing a multilayer printed circuit board of a built-in electronic device according to in claim 1, wherein the adhesive agent is a non-conductive adhesive.

8. The method of manufacturing a multilayer printed circuit board of a built-in electronic device according to in claim 5, wherein the protective plastic layer or the second dielectric layer has a micro via formed at a position opposite to the electronic device and provided for exposing an electrode terminal of the electronic device to manufacture the electric circuit and perform a chemical electrodeposit copper and an electroplating process of the micro vias.

9. The method of manufacturing a multilayer printed circuit board of a built-in electronic device according to in claim 1, further conducting the electronic devices by a solder or a conductive paste.

10. The method of manufacturing a multilayer printed circuit board of a built-in electronic device according to in claim 1, wherein the electronic device is an active electronic device and a passive electronic device.

11. The method of manufacturing a multilayer printed circuit board of a built-in electronic device according to in claim 10, wherein the electronic device is a light emitting element or a light emitting diode.

12. The method of manufacturing a multilayer printed circuit board of a built-in electronic device according to in claim 11, wherein the build-up circuit layer has an opening formed at a position opposite to the light emitting element when the build-up circuit layer is formed on the second dielectric layer, such that the light emitting element is exposed without being covered.

13. The method of manufacturing a multilayer printed circuit board of a built-in electronic device according to in claim 1, wherein the build-up circuit layer includes a through hole mechanically drilled through the build-up layer for performing a chemical electrodeposit copper of the through hole and electroplating the through hole to electrically conduct the basic circuit board and the build-up circuit layer.

14. The method of manufacturing a multilayer printed circuit board of a built-in electronic device according to in claim 1, wherein the metal board of the copper clad laminate is a copper board or an aluminum board.

15. The method of manufacturing a multilayer printed circuit board of a built-in electronic device according to in claim 1, wherein the metal board of the second copper clad laminate is a copper board or an aluminum board.

* * * * *